(12) United States Patent
Betser et al.

(10) Patent No.: US 7,184,313 B2
(45) Date of Patent: Feb. 27, 2007

(54) METHOD CIRCUIT AND SYSTEM FOR COMPENSATING FOR TEMPERATURE INDUCED MARGIN LOSS IN NON-VOLATILE MEMORY CELLS

(75) Inventors: Yoram Betser, Mazkeret Batya (IL); Yair Sofer, Tel-Aviv (IL); Eduardo Maayan, Kfar Saba (IL)

(73) Assignee: Saifun Semiconductors Ltd., Netanya (IL)

( * ) Notice: Subject to any disclaimer, the term of this patent is extended or adjusted under 35 U.S.C. 154(b) by 9 days.

(21) Appl. No.: 11/155,252

(22) Filed: Jun. 17, 2005

(65) Prior Publication Data
US 2006/0285408 A1 Dec. 21, 2006

(51) Int. Cl.
*G11C 16/04* (2006.01)
(52) U.S. Cl. ............... 365/185.24; 365/185.29
(58) Field of Classification Search ........... 365/185.24
See application file for complete search history.

(56) References Cited

U.S. PATENT DOCUMENTS

| | | | |
|---|---|---|---|
| 3,881,180 A | 4/1975 | Gosney, Jr. |
| 3,895,360 A | 7/1975 | Cricchi et al. |
| 4,342,102 A | 7/1982 | Puar |
| 4,388,705 A | 6/1983 | Sheppard |
| 4,527,257 A | 7/1985 | Cricchi |
| 4,667,217 A | 5/1987 | Janning |
| 4,725,984 A | 2/1988 | Ip et al. |
| 4,733,105 A | 3/1988 | Shin et al. |
| 4,742,491 A | 5/1988 | Liang et al. |
| 4,857,770 A | 8/1989 | Partovi et al. |
| 4,916,671 A | 4/1990 | Ichiguchi |
| 4,961,010 A | 10/1990 | Davis |
| 5,027,321 A | 6/1991 | Park |
| 5,029,063 A | 7/1991 | Lingstaedt et al. |
| 5,042,009 A | 8/1991 | Kazerounian et al. |
| 5,081,371 A | 1/1992 | Wong |
| 5,142,496 A | 8/1992 | Van Buskirk |
| 5,237,213 A | 8/1993 | Tanoi |
| 5,241,497 A | 8/1993 | Komarek |
| 5,276,646 A | 1/1994 | Kim et al. |

(Continued)

FOREIGN PATENT DOCUMENTS

EP 0693781 1/1996

(Continued)

*Primary Examiner*—Thong Q. Le
(74) *Attorney, Agent, or Firm*—Eitan Law Group (57) ABSTRACT

The present invention consists of a method and system for compensating, over time and over an operating temperature range, for margin loss in a non-volatile memory ("NVM") cell, which method comprises selection of a reference level based on temperature readings obtained from a temperature sensing element that is thermally coupled, directly or indirectly, to the NVM cell. The reference level may be selected from a group consisting of references levels of various types, or it may be obtained by adjusting the output of a single reference based on the temperature reading(s), or it may be obtained by utilizing pre-stored conversion data, which conversion data associates a given temperature reading with a corresponding temperature range that is, in turn, associated with a corresponding reference level. A pool of likewise reference cells may be provided, and the reference level may be selected from this pool, based on its association to the temperature reading. The pool of reference cells may consist of Program verify reference cells, or Erase verify reference cells.

34 Claims, 4 Drawing Sheets

U.S. PATENT DOCUMENTS

| | | |
|---|---|---|
| 5,280,420 A | 1/1994 | Rapp |
| 5,289,412 A | 2/1994 | Frary et al. |
| 5,293,563 A | 3/1994 | Ohta |
| 5,295,108 A | 3/1994 | Higa |
| 5,305,262 A | 4/1994 | Yoneda |
| 5,345,425 A | 9/1994 | Shikatani |
| 5,349,221 A | 9/1994 | Shimoji |
| 5,359,554 A | 10/1994 | Odake et al. |
| 5,400,286 A | 3/1995 | Chu et al. |
| 5,418,743 A | 5/1995 | Tomioka et al. |
| 5,422,844 A | 6/1995 | Wolstenholme et al. |
| 5,424,978 A | 6/1995 | Wada et al. |
| 5,434,825 A | 7/1995 | Harari |
| 5,440,505 A | 8/1995 | Fazio et al. |
| 5,450,341 A | 9/1995 | Sawada et al. |
| 5,450,354 A | 9/1995 | Sawada et al. |
| 5,477,499 A | 12/1995 | Van Buskirk et al. |
| 5,521,870 A | 5/1996 | Ishikawa |
| 5,523,972 A | 6/1996 | Rashid et al. |
| 5,534,804 A | 7/1996 | Woo |
| 5,537,358 A | 7/1996 | Fong |
| 5,553,030 A | 9/1996 | Tedrow et al. |
| 5,557,221 A | 9/1996 | Taguchi et al. |
| 5,557,570 A | 9/1996 | Iwahashi |
| 5,559,687 A | 9/1996 | Nicollini et al. |
| 5,563,823 A | 10/1996 | Yiu et al. |
| 5,568,085 A | 10/1996 | Eitan et al. |
| 5,579,199 A | 11/1996 | Kawamura et al. |
| 5,581,252 A | 12/1996 | Thomas |
| 5,583,808 A | 12/1996 | Brahmbhatt |
| 5,590,074 A | 12/1996 | Akaogi et al. |
| 5,596,527 A | 1/1997 | Tomioka et al. |
| 5,608,679 A | 3/1997 | Mi et al. |
| 5,612,642 A | 3/1997 | McClinyock |
| 5,623,438 A | 4/1997 | Guritz et al. |
| 5,633,603 A | 5/1997 | Lee |
| 5,636,288 A | 6/1997 | Bonneville et al. |
| 5,657,332 A | 8/1997 | Auclair et al. |
| 5,663,907 A | 9/1997 | Frayer et al. |
| 5,672,959 A | 9/1997 | Der |
| 5,675,280 A | 10/1997 | Nomura |
| 5,677,869 A | 10/1997 | Fazio et al. |
| 5,689,459 A | 11/1997 | Chang et al. |
| 5,694,356 A | 12/1997 | Wong et al. |
| 5,708,608 A | 1/1998 | Park et al. |
| 5,712,815 A | 1/1998 | Bill et al. |
| 5,715,193 A | 2/1998 | Norman |
| 5,717,581 A | 2/1998 | Canclini |
| 5,717,632 A | 2/1998 | Richart et al. |
| 5,717,635 A | 2/1998 | Akatsu |
| 5,726,946 A | 3/1998 | Yamagata et al. |
| 5,748,534 A | 5/1998 | Dunlap et al. |
| 5,751,637 A | 5/1998 | Chen et al. |
| 5,754,475 A | 5/1998 | Bill et al. |
| 5,760,634 A | 6/1998 | Fu |
| 5,768,193 A | 6/1998 | Lee et al. |
| 5,774,395 A | 6/1998 | Richart et al. |
| 5,781,476 A | 7/1998 | Seki et al. |
| 5,784,314 A | 7/1998 | Sali et al. |
| 5,787,036 A | 7/1998 | Okazawa |
| 5,805,500 A | 9/1998 | Campardo et al. |
| 5,808,506 A | 9/1998 | Tran |
| 5,812,449 A | 9/1998 | Song |
| 5,812,456 A | 9/1998 | Hull et al. |
| 5,812,457 A | 9/1998 | Arase |
| 5,815,435 A | 9/1998 | Van Tran |
| 5,828,601 A | 10/1998 | Hollmer et al. |
| 5,841,700 A | 11/1998 | Chang |
| 5,847,441 A | 12/1998 | Cutter et al. |
| 5,861,771 A | 1/1999 | Matsuda et al. |
| 5,867,429 A | 2/1999 | Chen et al. |
| 5,870,334 A | 2/1999 | Hemink et al. |
| 5,870,335 A | 2/1999 | Khan et al. |
| 5,880,620 A | 3/1999 | Gitlin et al. |
| 5,886,927 A | 3/1999 | Takeuchi |
| RE36,179 E | 4/1999 | Shimoda |
| 5,892,710 A | 4/1999 | Fazio et al. |
| 5,903,031 A | 5/1999 | Yamada et al. |
| 5,910,924 A | 6/1999 | Tanaka et al. |
| 5,926,409 A | 7/1999 | Engh et al. |
| 5,933,367 A | 8/1999 | Matsuo et al. |
| 5,936,888 A | 8/1999 | Sugawara |
| 5,946,258 A | 8/1999 | Evertt et al. |
| 5,949,714 A | 9/1999 | Hemink et al. |
| 5,949,728 A | 9/1999 | Liu et al. |
| 5,963,412 A | 10/1999 | En |
| 5,969,993 A | 10/1999 | Takeshima |
| 5,982,666 A | 11/1999 | Campardo |
| 5,991,202 A | 11/1999 | Derhacobian et al. |
| 5,999,444 A | 12/1999 | Fujiwara et al. |
| 6,005,423 A | 12/1999 | Schultz |
| 6,011,725 A | 1/2000 | Eitan |
| 6,028,324 A | 2/2000 | Su et al. |
| 6,034,896 A | 3/2000 | Ranaweera et al. |
| 6,040,610 A | 3/2000 | Noguchi et al. |
| 6,044,019 A | 3/2000 | Cernea et al. |
| 6,044,022 A | 3/2000 | Nachumovsky |
| 6,064,251 A | 5/2000 | Park |
| 6,064,591 A | 5/2000 | Takeuchi et al. |
| 6,074,916 A | 6/2000 | Cappelletti |
| 6,075,402 A | 6/2000 | Ghilardelli |
| 6,075,724 A | 6/2000 | Li et al. |
| 6,078,518 A | 6/2000 | Chevallier |
| 6,081,456 A | 6/2000 | Dadashev |
| 6,084,794 A | 7/2000 | Lu et al. |
| 6,091,640 A | 7/2000 | Kawahara et al. |
| 6,094,095 A | 7/2000 | Murray et al. |
| 6,097,639 A | 8/2000 | Choi et al. |
| 6,107,862 A | 8/2000 | Mukainakano et al. |
| 6,108,240 A | 8/2000 | Lavi et al. |
| 6,108,241 A | 8/2000 | Chevallier |
| 6,118,207 A | 9/2000 | Ormerod et al. |
| 6,118,692 A | 9/2000 | Banks |
| 6,128,226 A | 10/2000 | Eitan et al. |
| 6,130,572 A | 10/2000 | Ghilardelli et al. |
| 6,130,574 A | 10/2000 | Bloch et al. |
| 6,134,156 A | 10/2000 | Eitan |
| 6,147,904 A | 11/2000 | Liron |
| 6,150,800 A | 11/2000 | Kinoshita et al. |
| 6,154,081 A | 11/2000 | Pakkala et al. |
| 6,157,242 A | 12/2000 | Fukui |
| 6,157,570 A | 12/2000 | Nachumovsky |
| 6,169,691 B1 | 1/2001 | Pasotti et al. |
| 6,181,605 B1 | 1/2001 | Hollmer et al. |
| 6,185,143 B1 | 2/2001 | Perner et al. |
| 6,188,211 B1 | 2/2001 | Rincon-Mora et al. |
| 6,192,445 B1 | 2/2001 | Rezvani |
| 6,198,342 B1 | 3/2001 | Kawai |
| 6,201,737 B1 | 3/2001 | Hollmer et al. |
| 6,205,056 B1 | 3/2001 | Pan et al. |
| 6,208,200 B1 | 3/2001 | Arakawa |
| 6,214,666 B1 | 4/2001 | Mehta |
| 6,215,148 B1 | 4/2001 | Eitan |
| 6,215,697 B1 | 4/2001 | Lu et al. |
| 6,215,702 B1 | 4/2001 | Derhacobian et al. |
| 6,219,277 B1 | 4/2001 | Devin et al. |
| 6,222,762 B1 | 4/2001 | Guterman et al. |
| 6,233,180 B1 | 5/2001 | Eitan et al. |
| 6,240,032 B1 | 5/2001 | Fukumoto |
| 6,240,040 B1 | 5/2001 | Akaogi et al. |
| 6,246,555 B1 | 6/2001 | Tham |
| 6,252,799 B1 | 6/2001 | Liu et al. |
| 6,256,231 B1 | 7/2001 | Lavi et al. |
| 6,266,281 B1 | 7/2001 | Derhacobian et al. |

| | | |
|---|---|---|
| 6,282,133 B1 | 8/2001 | Nakagawa et al. |
| 6,285,246 B1 | 9/2001 | Basu |
| 6,285,614 B1 | 9/2001 | Mulatti et al. |
| 6,292,394 B1 | 9/2001 | Cohen et al. |
| 6,297,974 B1 | 10/2001 | Ganesan et al. |
| 6,304,485 B1 | 10/2001 | Harari et al. |
| 6,307,784 B1 | 10/2001 | Hamilton et al. |
| 6,307,807 B1 | 10/2001 | Sakui et al. |
| 6,320,786 B1 | 11/2001 | Chang et al. |
| 6,324,094 B1 | 11/2001 | Chevallier |
| 6,326,265 B1 | 12/2001 | Liu et al. |
| 6,330,192 B1 | 12/2001 | Ohba et al. |
| 6,331,950 B1 | 12/2001 | Kuo et al. |
| 6,343,033 B1 | 1/2002 | Parker |
| 6,351,415 B1 | 2/2002 | Kushnarenko |
| 6,353,356 B1 | 3/2002 | Liu |
| 6,353,554 B1 | 3/2002 | Banks |
| 6,353,555 B1 | 3/2002 | Jeong |
| 6,359,501 B2 | 3/2002 | Lin et al. |
| 6,385,086 B1 | 5/2002 | Mihara et al. |
| 6,396,741 B1 | 5/2002 | Bloom et al. |
| 6,400,209 B1 | 6/2002 | Matsuyama et al. |
| 6,407,537 B2 | 6/2002 | Antheunis |
| 6,426,898 B1 | 7/2002 | Mihnea et al. |
| 6,433,624 B1 | 8/2002 | Grossnikle et al. |
| 6,438,031 B1 | 8/2002 | Fastow |
| 6,442,074 B1 | 8/2002 | Hamilton et al. |
| 6,445,030 B1 | 9/2002 | Wu et al. |
| 6,449,190 B1 | 9/2002 | Bill |
| 6,452,438 B1 | 9/2002 | Li |
| 6,456,528 B1 | 9/2002 | Chen |
| 6,456,533 B1 | 9/2002 | Hamilton et al. |
| 6,469,929 B1 | 10/2002 | Kushnarenko et al. |
| 6,469,935 B2 | 10/2002 | Hayashi |
| 6,477,085 B1 | 11/2002 | Kuo |
| 6,490,204 B2 * | 12/2002 | Bloom et al. .......... 365/185.28 |
| 6,496,414 B2 | 12/2002 | Kasa et al. |
| 6,510,082 B1 | 1/2003 | Le et al. |
| 6,512,701 B1 | 1/2003 | Hamilton et al. |
| 6,519,180 B2 | 2/2003 | Tran et al. |
| 6,519,182 B1 | 2/2003 | Derhacobian et al. |
| 6,522,585 B2 | 2/2003 | Pasternak |
| 6,535,020 B1 | 3/2003 | Yin |
| 6,535,434 B2 | 3/2003 | Maayan et al. |
| 6,552,387 B1 | 4/2003 | Eitan |
| 6,567,303 B1 | 5/2003 | Hamilton et al. |
| 6,567,312 B1 | 5/2003 | Torii et al. |
| 6,574,139 B2 | 6/2003 | Kurihara |
| 6,577,514 B2 | 6/2003 | Shor et al. |
| 6,577,532 B1 | 6/2003 | Chevallier |
| 6,577,547 B2 | 6/2003 | Ukon |
| 6,584,017 B2 | 6/2003 | Maayan et al. |
| 6,590,811 B1 | 7/2003 | Hamilton et al. |
| 6,594,181 B1 | 7/2003 | Yamada |
| 6,608,526 B1 | 8/2003 | Sauer |
| 6,614,295 B2 | 9/2003 | Tsuchi |
| 6,618,290 B1 | 9/2003 | Wang et al. |
| 6,624,672 B2 | 9/2003 | Confaloneri et al. |
| 6,627,555 B2 | 9/2003 | Eitan et al. |
| 6,636,440 B2 | 10/2003 | Maayan et al. |
| 6,639,837 B2 | 10/2003 | Takano et al. |
| 6,639,844 B1 | 10/2003 | Liu et al. |
| 6,639,849 B2 | 10/2003 | Takahashi et al. |
| 6,643,177 B1 | 11/2003 | Le et al. |
| 6,643,178 B2 | 11/2003 | Kurihara |
| 6,643,181 B2 | 11/2003 | Sofer et al. |
| 6,650,568 B2 | 11/2003 | Iijima |
| 6,654,296 B2 | 11/2003 | Jang et al. |
| 6,665,769 B2 | 12/2003 | Cohen et al. |
| 6,677,805 B2 | 1/2004 | Shor et al. |
| 6,690,602 B1 | 2/2004 | Le et al. |
| 6,700,818 B2 | 3/2004 | Shappir et al. |
| 6,723,518 B2 | 4/2004 | Papsidero et al. |
| 6,768,165 B1 | 7/2004 | Eitan |
| 6,788,579 B2 | 9/2004 | Gregori et al. |
| 6,791,396 B2 | 9/2004 | Shor et al. |
| 6,831,872 B2 | 12/2004 | Matsuoka |
| 6,836,431 B2 | 12/2004 | Chang |
| 6,885,585 B2 | 4/2005 | Maayan et al. |
| 6,917,544 B2 | 7/2005 | Maayan et al. |
| 6,928,001 B2 | 8/2005 | Avni et al. |
| 2002/0004878 A1 | 1/2002 | Norman |
| 2002/0132436 A1 | 9/2002 | Ellyahu et al. |
| 2002/0145465 A1 | 10/2002 | Shor et al. |
| 2002/0191465 A1 | 12/2002 | Maayan et al. |
| 2003/0021155 A1 | 1/2003 | Yachareni et al. |
| 2003/0072192 A1 | 4/2003 | Bloom et al. |
| 2003/0076710 A1 | 4/2003 | Sofer et al. |
| 2003/0117841 A1 | 6/2003 | Yamashita |
| 2003/0131186 A1 | 7/2003 | Buhr |
| 2003/0142544 A1 | 7/2003 | Maayan et al. |
| 2003/0202411 A1 | 10/2003 | Yamada |
| 2003/0206435 A1 | 11/2003 | Takahashi |
| 2003/0208663 A1 | 11/2003 | Van Buskirk et al. |
| 2003/0214844 A1 | 11/2003 | Iijima |
| 2003/0218913 A1 | 11/2003 | Le et al. |
| 2003/0227796 A1 | 12/2003 | Miki et al. |
| 2004/0012993 A1 | 1/2004 | Kurihara |
| 2004/0013000 A1 | 1/2004 | Torii |
| 2004/0027858 A1 | 2/2004 | Takahashi et al. |
| 2004/0151034 A1 | 8/2004 | Shor et al. |
| 2004/0153621 A1 | 8/2004 | Polansky et al. |

FOREIGN PATENT DOCUMENTS

| | | |
|---|---|---|
| EP | 0 843 398 | 5/1998 |
| EP | 1126468 | 8/2001 |
| EP | 0740307 | 12/2001 |
| EP | 1164597 | 12/2001 |
| EP | 001217744 | 3/2004 |
| JP | 63-249375 | 10/1988 |
| JP | 3-285358 | 12/1991 |
| JP | 408106791 | 4/1996 |
| JP | 408297988 | 11/1996 |
| JP | 10-106276 | 4/1998 |
| JP | 02001118392 | 4/2001 |
| JP | 02002216488 | 8/2002 |
| WO | WO 00/46808 | 8/2000 |
| WO | WO 01/65566 | 9/2001 |
| WO | WO 01/65567 | 9/2001 |
| WO | WO 02/43073 | 5/2003 |
| WO | WO 03/036651 | 5/2003 |
| WO | WO 03/063167 | 7/2003 |
| WO | WO 03/063168 | 7/2003 |
| WO | WO 03/079370 | 9/2003 |
| WO | WO 03/088258 | 10/2003 |
| WO | WO 03/088259 | 10/2003 |
| WO | WO 03/088260 | 10/2003 |
| WO | WO 03/088261 | 10/2003 |

* cited by examiner

METHOD CIRCUIT AND SYSTEM FOR COMPENSATING FOR TEMPERATURE INDUCED MARGIN LOSS IN NON-VOLATILE MEMORY CELLS

FIELD OF THE INVENTION

The present invention relates generally to the field of non-volatile memory cells. More particularly, the present invention relates to a method, circuit and system for compensating over time for margin loss in non-volatile memory ("NVM") cells over an operating temperature range.

BACKGROUND OF THE INVENTION

Figure 1:
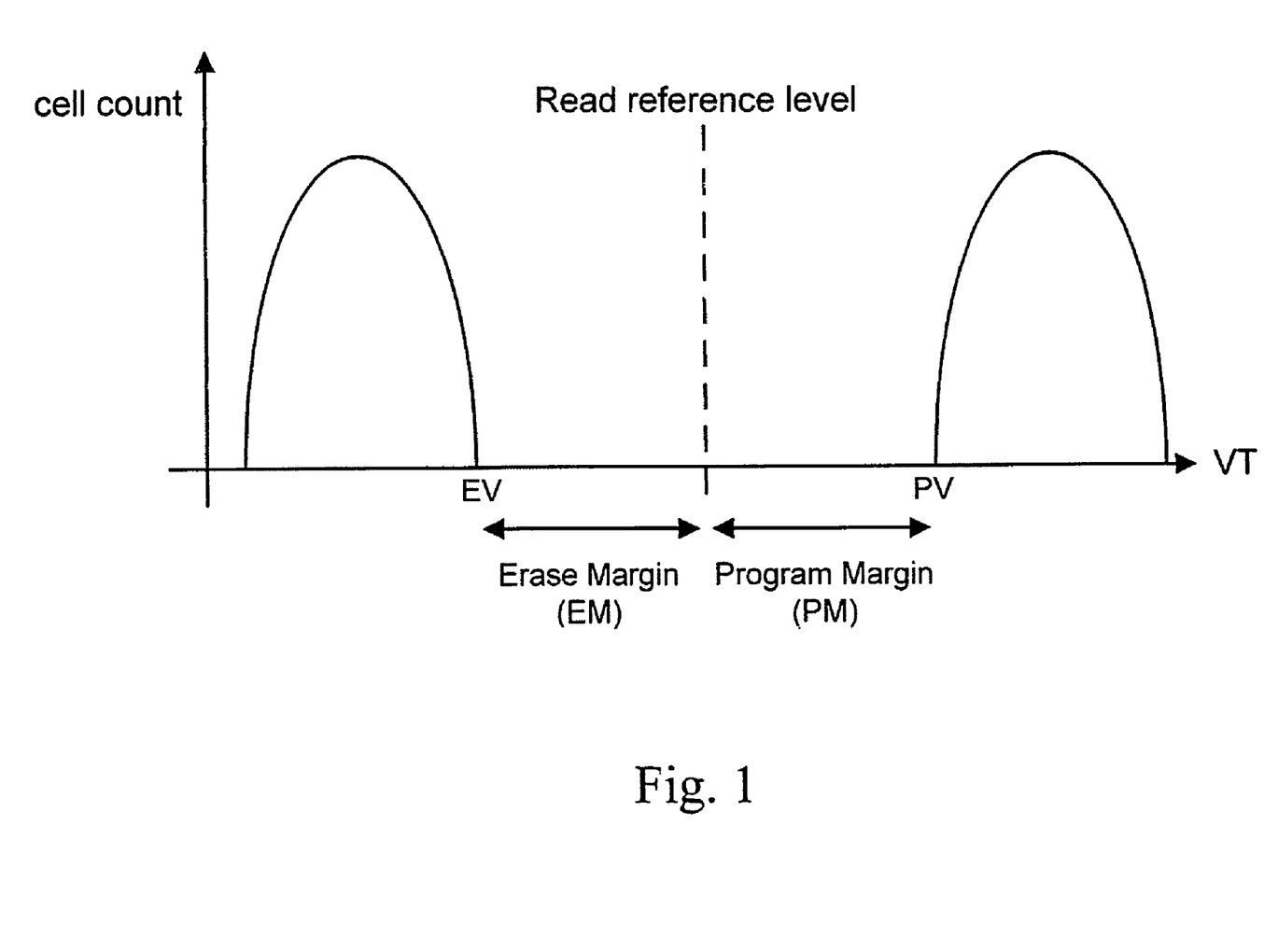
FIG. 1 shows an exemplary VT distribution of programmed and erased non-volatile memory cells as read with respect to a read reference level/cell.

NVM cells are generally operated (e.g. programmed, read, and erased) using one or more reference cells and/or structures. In order to determine a condition or state of a memory cell being operated, the cell's operating characteristics may be compared against a reference memory cell or structure usually operated under similar conditions as the cell of interest. As is well known, an NVM cell's state may be defined and determined by its threshold voltage, the voltage at which the cell begins to conduct current. A NVM cell's threshold voltage level is typically correlated to the amount of charge stored in a charge storage region of the cell. Different threshold voltage ranges are associated with different states of an NVM cell. FIG. 1 shows a statistical/probabilistic graph depicting an expected distribution of NVM cells within and around the voltage boundaries of two logical states, erased and programmed, of a binary NVM cell, and the buffer region in between the two states.

When programming a NVM cell to a desired state, after each programming pulse, the NVM cell's threshold value may be compared against a reference cell having a reference threshold value set at a voltage level defined as the "program verify" level. The reference cell with a threshold voltage set at a voltage level defined as a "program verify" level for the given state may be compared to the threshold voltage of the cell being programmed (i.e. charged) in order to determine whether a charge storage area or region of the cell being programmed has been sufficiently charged so as to be considered "programmed" at the desired state.

When reading a NVM cell, however, to determine whether it is in a particular state, the cell's threshold voltage may be compared against that of a reference cell having a reference threshold voltage defined as a "read verify" level for the specific state. A "read verify" level for a given state is usually set slightly lower than a "program verify" level for that state in order to compensate for voltage drift which may occur after programming.

In standard NVM cells, program or erase operations on memory cells are usually performed by repetitively applying programming or erasing pulses to the memory cells, followed by one or more program and erase verification steps. In such verification steps, the cells' states are verified to ensure a specific margin against some reference state or level. If the margin is verified then usually no further programming or erasing pulses are applied, and the verified cells are considered to be in a programmed or erased state. The reference state against which the memory cells are measured or compared may be generated by a non-volatile memory reference cell, by a reference voltage or current generator, or by other well known means. The margin is typically measured in terms of Threshold Voltage ($V_T$) difference, voltage or current signals difference, or by other means. Comparing the threshold voltage of a NVM cell to that of a reference cell is often accomplished using a sense amplifier. Various techniques for comparing an NVM's threshold voltage against those of one or more reference cells, in order to determine the NVM's cells state, are well known.

Program or erase margin verification may be required to ensure that the memory cells are reliably readable along the cells' lifetime, i.e. the memory cells' states are correctly and reliably detectable. As visible from FIG. 1, the Erase Margin (EM) may be defined as the $V_T$ difference between a Read Reference $V_T$ state and an Erase Verify $V_T$ state (EV). The $V_T$ distribution of memory cells immediately after being erased and verified is expected to be below or at the EV level. Similarly, the Program Margin (PM) may be defined as the $V_T$ difference between a Program Verify state (PV) and a Read Reference $V_T$ state. The $V_T$ distribution of memory cells immediately after being programmed and verified is expected to be higher or at the PV level. As explained above, once the necessary EM or PM is achieved, the erase or program operation on the NVM cell may be concluded.

However, as is well known the program and erase margins may detrimentally vary due to any one or several factors, including but not limited to charge leakage from the cell's charge storage region, temperature changes, and due to interference from the operation of neighboring NVM cells. Among the various factors, temperature deviations a cell may experience between the time it is programmed and read may result in deviations up to several hundreds of millivolts in the threshold voltage of a memory cell, which may detrimentally affect these margins. Assuming that the write operation (program or erase operations including the verification steps) was performed at a certain temperature, it is necessary to ensure that the inserted margins are maintained over all the operating temperatures range, otherwise the reliability of the memory cells read may be affected.

Being fabricated substantially under the same manufacturing conditions, NVM cells and reference cells, which typically reside on the same substrate, initially have similar temperature coefficients, resulting in both of them being potentially equally affected by temperature deviations within the operating temperature range. However, reference cells usually undergo one 'operating cycle'. That is, they are typically programmed only once, to a distinct (reference) state against which the NVM cell may be compared, whereas NVM cells are likely to experience numerous programming and erasing cycles, causing the NVM cells to rapidly age during their lifetime. Different programmed or erased state, as well as different aging of a NVM cell and a reference cell results in their temperature coefficients diverging. In general, the more programming/erasing cycles a NVM cell undergoes, the greater the divergence becomes, until, at some certain point, the margins become detrimentally affected (i.e., reduced).

Figure 2:
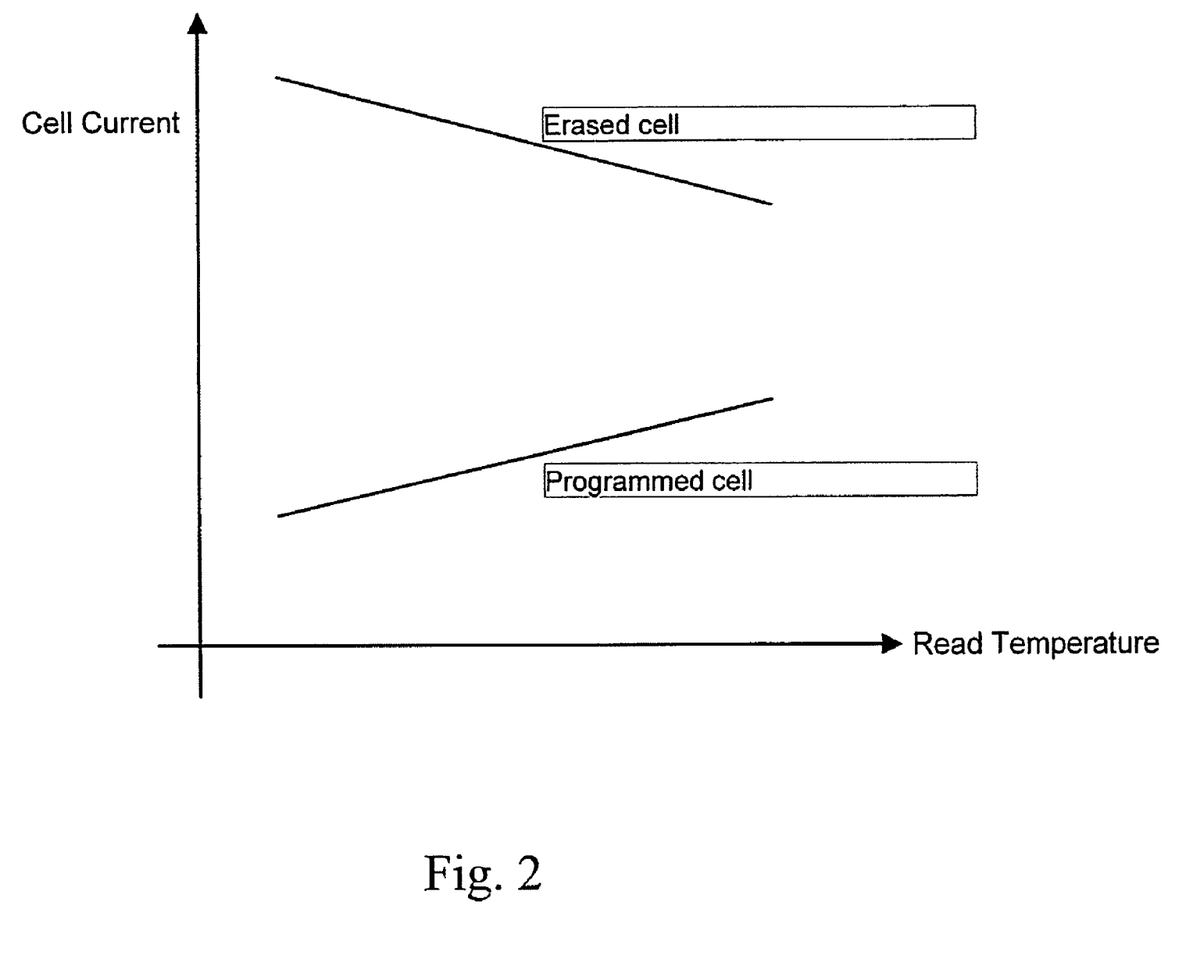
FIGS. 2 schematically illustrates an example of temperature characteristics of erased and programmed non-volatile memory cells.

Taking as an example a non-volatile memory array, in which the NVM cells are verified against a reference cell, then it is known that non-volatile memory cells operated at the same conditions but having different states (i.e. having different $V_T$'S), or having the same state but operated at different conditions (e.g. at a different gate voltage), do not necessarily have the same temperature coefficients of their trans-conductance and/or current characteristics. An example for such a case is shown in FIG. 2, where the temperature dependence of NROM flash cells is shown. As can be seen, the erased NROM cell current decreases as temperature increases, while the programmed NROM cell current increases as temperature increases. In FIG. 2 linear characteristics are shown, although the real characteristics are monotonic, but typically non-linear. Let us now assume that the write operation was performed at a low temperature, and as an example, a reference cell with a specific $V_T$ is used for the insertion and verification of the EM or PM margins. If the reference cell has a reference $V_T$ level as shown in FIG. 1, then the EM or PM margins can be verified, for example, by reading the flash cell against the reference cell while applying a reference-gate-voltage (VGREF) to the reference cell, and either a different gate voltage equal to VGREF-EM to the flash cell to be erase verified, or a VGREF+PM gate voltage to the flash cells to be program verified. Thus, it is expected that the $V_T$ distribution of the NVM cells, measured at the same temperature as the write operation and using the same reference cell, would be exactly as shown in FIG. 1. However, measuring the $V_T$ distribution of the NVM cells at a higher temperature than the write operation temperature would effectively reduce the margin for both the programmed cells and the erased cells.

Figure 3:
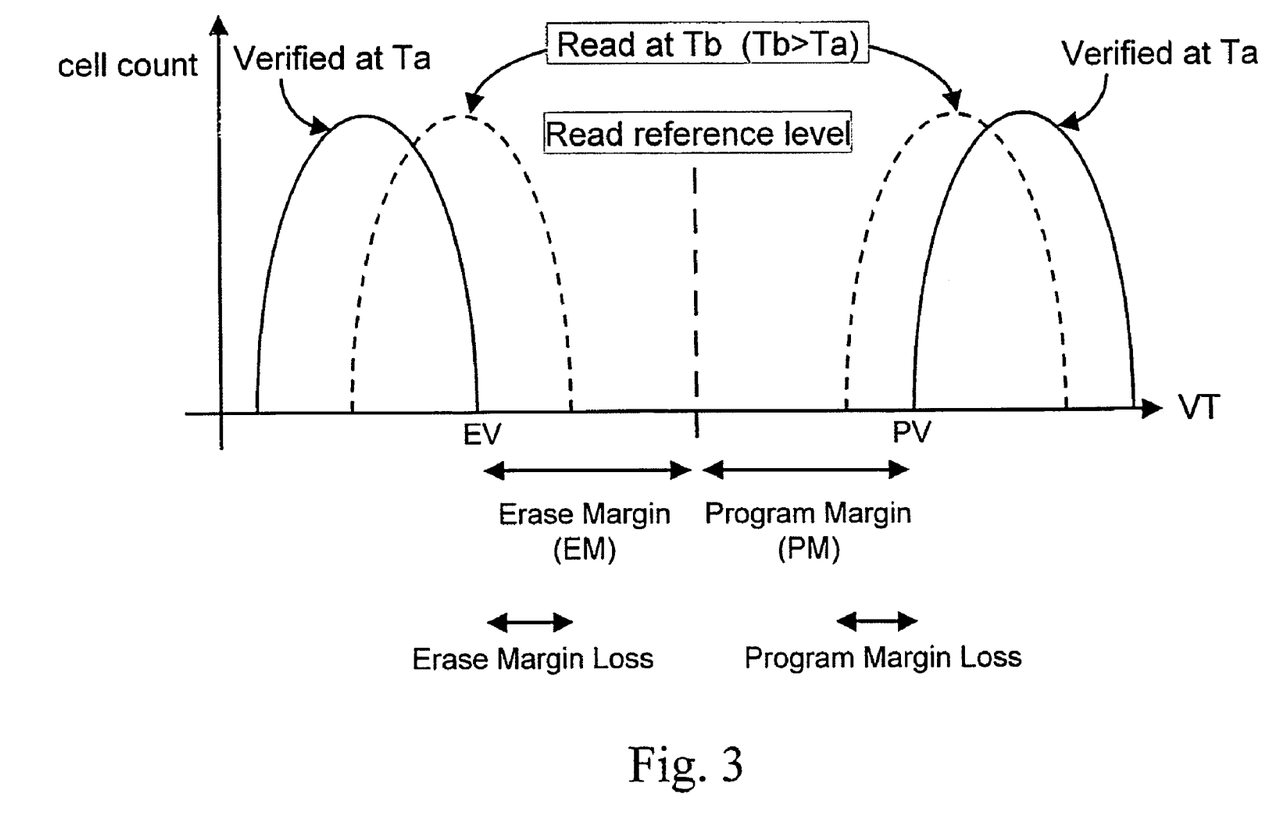
FIG. 3 shows two exemplary VT distributions of the same non-volatile memory cells with respect to the same reference cell at two different temperatures, Ta and Tb, where Ta<Tb.

In FIG. 3 the $V_T$ distribution taken at low temperature and high temperature is shown. Based on FIG. 2 characteristics, at high temperature, the erased cells seem to be less erased (lower cell current) and the programmed cells seem to be less programmed (higher cell current). Thus the initial margins that were inserted during the write operation are reduced. This reduction is usually referred as a "temperature induced margin loss" and affects the fidelity of correctly reading erased or programmed cells.

In addition to the temperature dependence of the memory cells characteristics, the performance of the peripheral circuits used to readout the cells contents may also vary with temperature. One such example may be the voltages generated on-die and used to bias the read access path or the cells terminals that may vary with temperature. Another example may be the performance of the sense amplifiers used to readout the cells. The sense amplifier gain, offset, or response time may vary with temperature too. As a result, the peripheral circuits performance variations with temperature may further affect the fidelity of the non-volatile memory cells readout. This effect can also be accounted as a "temperature induced margin loss". As described above, compensating for this margin loss by increasing the operating window (the EM and PM margins) detrimentally affects the cells endurance and retention characteristics.

Non-volatile memory devices usually use larger EM and PM fixed margins to compensate for the temperature induced margin loss. However, when the device is operated at low temperatures then the larger operating window (EM+PM) detrimentally affects the cells endurance and retention characteristics.

Variation of the threshold voltage of memory cells may lead to false readings of their state and may further result in the corruption of the data in the memory array. Voltage drift is especially problematic in Multi-Level Cell ("MLC") NVM cells where the $V_T$ regions or sub-ranges associated with each programmed state are relatively smaller than those for a typical binary cell. The voltage threshold boundaries which define a given state in an MLC cell are usually considerably smaller than those for a binary NVM cell. Because in an MLC cell a fixed range of potential threshold voltages (e.g. 3 Volts to 9 Volts) needs to be split into several sub-ranges or regions, the size of each sub-range or region in an MLC is usually smaller than a region of a binary NVM cell, which binary cell only requires three voltage threshold regions, as seen in FIG. 1.

Thus, there is a need for a method to reduce the temperature induced margin loss without the above described detrimental effects.

SUMMARY OF THE INVENTION

As part of the present invention, there is provided a method of compensating, over time and over an operating temperature range, for margin loss in a non-volatile memory ("NVM") cell, which method comprises selection of a reference level based on temperature readings obtained from a temperature sensing element that is thermally coupled, directly or indirectly, to the NVM cell.

In an aspect of the present invention, the reference level may be selected from a group consisting of {Read reference level, Erase reference level, Program reference level}.

In some preferred embodiments of the present invention, the reference level may be obtained by adjusting the output of a single reference based on the temperature reading(s).

In some preferred embodiments of the present invention, the reference level may be obtained by utilizing pre-stored conversion data, which conversion data associates a given temperature reading to a corresponding temperature range, which is associated with a corresponding reference level.

In an aspect of the present invention, a program verify operation may be performed by applying to the NVM cell's gate a voltage that is higher than the gate voltage of the read reference cell, the difference therebetween is based on the temperature reading(s).

In another aspect of the present invention, an erase verify operation may be performed by applying to the NVM cell's gate a voltage that is lower than the gate voltage of the read reference cell, the difference therebetween is based on the temperature reading(s).

In some preferred embodiments of the present invention, a plurality of reference cells may be provided, and the reference level may be selected from a pool of reference cells based on its association to the temperature reading.

In an aspect of the present invention, the pool of reference cells are Program verify reference cells.

In another aspect of the present invention, the pool of reference cells are Erase verify reference cells.

In some preferred embodiments of the present invention, a margin direct current ("DC") signal is compared either to the NVM cell's signal or to the reference cell's signal, or both to the NVM cell's signal and to the reference cell's signal, and the margin DC signal is adjusted in accordance with the temperature readings.

In some preferred embodiments of the present invention, the verify reference NVM cell's signal is compared to a DC reference signal. The verify reference signal may be generated internally (i.e., in a reference cell), or externally.

In some preferred embodiments of the present invention, the operating conditions of the NVM cells being read and/or of the peripheral circuits used to read the cells are adjusted in accordance with the temperature readings.

In some preferred embodiments of the present invention, the program and erase verifying reference cells are differently adjusted or selected for program and erase verify operations.

In some preferred embodiments of the present invention, a reference cell for a program verify operation is selected such that its volt threshold ("VT") is higher as the temperature of the NVM cell increases.

In some preferred embodiments of the present invention, a reference cell for an erase verify operation is selected such that its volt threshold ("VT") is lower as the temperature of the NVM cell decreases.

In some preferred embodiments of the present invention, the program and/or erase margins are adjusted by adding a constant offset signal either to the NVM cell signal or to the reference cell signal, or both to the NVM cell and reference signals, during program or erase verify operations.

In some preferred embodiments of the present invention, the program and erase margins are adjusted by selecting a different reference signal to be used in the program or erase verify operations.

In some preferred embodiments of the present invention, the temperature reading is taken at the initiation of a program or erase operation.

In some preferred embodiments of the present invention, the temperature reading is taken at the initiation of a program verify or erase verify operation.

In some preferred embodiments of the present invention, the temperature reading is taken at least once during a program, erase, or a verify operation.

In some preferred embodiments of the present invention, temperature readings are taken intermittently or continuously.

As a part of the present invention, a system is also provided for compensating over time for margin loss over an operating temperature in non-volatile memory ("NVM") cell of interest in a NVM array of cells, which system comprises: a temperature sensing element(s) substantially thermally coupled to the cell or to said NVM array of cells, or to preferred portions thereof; a reference module operative to provide a reference level based on a signal from the temperature sensing element(s), against which the cell of interest is to be compared, which reference level defines program and erase margins; a sensing and readout module for performing the comparisons; an 'X-Y' driving and selection module operative to select the cell of interest from the NVM array of cells; a control logic operative to accept temperature readings from the temperature sensing element(s) for controlling the operation of the 'X-Y' driving and selection module and the reference module for performing program erase or reading operations on of said NVM cell; wherein the control logic is operative to accept a signal from the sensing and readout module to indicate the completion of the operations; and a power supply block for energizing the other modules.

As a part of the present invention, a circuit is also provided for compensating over time for margin loss in non-volatile memory ("NVM") cell of interest, over an operating temperature range, which circuit comprises: a temperature sensing element substantially thermally coupled to the NVM cell; and a controller operative to select a reference level based on a signal from the temperature sensor, and to utilize it to perform program, erase or reading operations on the NVM cell, which reference level defining program and erase margins.

As a part of the present invention, the non-volatile memory cell and reference cell are NROM-type non-volatile memory cells.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

The temperature of a semiconductor device at any given stage of its operation may be measured using one of several ways that are known in the art. In general, temperatures are measured using an electrical temperature detector that outputs a current, or voltage, signal that is a monotonic function, at least within the operating temperature range involved, of the measured temperature. The output signal of the temperature detector may be either an analog signal, or a digital word that is obtained by converting the analog output signal into a corresponding digital signal by using any standard analog-to-digital ("ADC") conversion techniques.

For discussion about 'on-die' temperature measurements, please refer to: [1] A. Bakker and J. H. Huijsing, "Micropower CMOS temperature sensor with digital output"; IEEE J. Solid-State Circuits, vol. 31, pp. 933–937, July 1996; [2] M. Tinko, "A two-terminal IC temperature transducer"; IEEE J. Solid-State Circuits, vol. SC-11, pp. 784–788, December 1976; or [3] Francisco Serra-Graells, Member, IEEE, and Jose Luis Huertas, Fellow, IEEE, "Sub-1-V CMOS Proportional-to-Absolute Temperature References"; IEEE JOURNAL OF SOLID-STATE CIRCUITS, VOL. 38, NO. 1, JANUARY 2003, the entire contents of which are incorporated by reference into this application for all purposes.

In accordance with the present invention, the program or erase margins used in the programming or erasing phases of a NVM cell may be adjusted according to the NVM cell's operating temperature. By 'adjustment of a margin', or, equivalently, 'adjustment of a verify reference level' (sometimes just 'reference level') is meant herein increasing, or decreasing, the reference level such that the margin of interest is maintained substantially the same irrespective of any temperature change within the relevant operating temperature range. By 'margin of interest' is meant; e.g., erase margin or program margin, each of which may be calculated with respect to; e.g., a read reference level, or erase reference level or program reference level.

As discussed hereinbelow the program and erase margins may be adjusted by a reference level that is either adjusted or selected based on the actual temperature of the NVM cell of interest. By 'adjusted' is meant herein changing, or manipulating, the output of a single reference cell to accommodate for temperature changes, whereas by 'selecting' is meant herein selection of a reference cell from a pool consisting of a plurality of reference cells of the same type (i.e., a pool of program reference cells, a pool of erase reference cells, etc.).

Advantageously, the actual margin's adjustment will be adapted according to the specific techniques used for measuring the NVM cell's temperature and related margins. For discussion about NVM devices' temperature measurement techniques, please refer to: U.S. Pat. No. 6,128,226 (Eitan, et al., Oct. 3, 2000); U.S. Pat. No. 6,134,156 (Eitan, Oct. 17, 2000) and U.S. Pat. No. 6,535,434 (Maayan, et al., Mar. 18, 2003), the entire contents of which are incorporated by reference into this application for all purposes.

For example, in cases where the (normally current) readout of an array cell is compared to the (normally current) readout of a reference cell, the margin(s) may be adjusted by manipulating the outputs of the cells involved by applying a voltage to the gate of the array cell which is not necessarily the same as the voltage applied to the gate of the reference cell. In such cases, a program verify operation may be applying to the array cell's gate a voltage that is higher by $\Delta_P$ than the gate voltage of a read reference cell. In the latter case, when the readout from the array cell signal is smaller than that of the read reference cell, it is most likely that a program margin of $\Delta_P$ is introduced; i.e. the threshold voltage of the array cell is at least higher by $\Delta_P$ than the read reference cell threshold voltage. A similar scheme may be used for an erase verify operation, but in this case the array cell would be operated at a gate voltage that is lower by $\Delta_P$ compared to the read reference cell gate voltage.

When a program or erase operation is requested, the operating temperature on-die may be intermittently or continuously measured to allow a corresponding margin to be selected; that is, should the need arises. The program or erase margins relevant to the operation in question (i.e., program or erase operation, respectively) may then be selected based on, or adjusted according to, a pre-determined conversion table such as Table-I.

Referring now to exemplary Table-I, each measured temperature may be associated with one of the temperature ranges (Tj<Temp<Tj+1, j=1, 2, ..., 5) within some overall operating temperature range (T1÷T5) and, once the respective temperature range is determined, the corresponding program and erase margins maybe be used, which are relevant to the specific measured temperature. Causing the program and erase margins to meet the conditions $\Delta P1 > \Delta P2 > \Delta P3 > \Delta P4$ and $\Delta E1 > \Delta E2 > \Delta E3 > \Delta E4$, respectively, will result in the temperature induced margin loss becoming significantly smaller in respect to using fixed program or erase margins.

Substantially no over-programming or over-erase will occur if the respective margin is adjusted according to the actual temperature at which the program, or erase, operations were performed, because, under such programming/erasing circumstances, the amount of programming or erasing of the cells is minimized. It is noted that despite of the margin(s) adjustments, the readouts from the cells over the whole operating temperature range are reliable.

TABLE I

| Temperature Range | Program Margin | Erase Margin |
|---|---|---|
| T1 <= Temp < T2 | $\Delta_{P1}$ | $\Delta_{E1}$ |
| T2 <= Temp < T3 | $\Delta_{P2}$ | $\Delta_{E2}$ |
| T3 <= Temp < T4 | $\Delta_{P3}$ | $\Delta_{E3}$ |
| T4 <= Temp < T5 | $\Delta_{P4}$ | $\Delta_{E4}$ |

The adjustment of the program and erase margins as a function of the operating temperature may be performed digitally or in analog manner. In particularly, a logic control circuit ("LCC"), which may reside inside the NVM device, may select the margin to be used based on a pre-stored look-up table similar to Table-I according to the actual temperature of the NVM cell(s) of interest. In some alternative embodiments, a signal representative of the monitored (either as an analog signal or as a digital word) temperature may be directly applied (i.e., without utilizing any conversion table) to affect, or generate, the margin in question.

As described hereinbefore, program and erase margins may be determined as such relative to a Read verify reference cell. However, this is not necessarily so, as the program and erase margins may be determined as such relative to a Program verify reference cell or to an Erase verify reference cell. A Program verify reference cell will normally have a VT that is higher than the Read reference cell VT, while an Erase verify reference cell will normally have a VT that is lower than the Read verify reference cell VT.

No matter what type of verify reference cell is actually utilized (i.e., Read, Program or Erase verify reference cell), the program and erase margins may be adjusted by applying a first voltage to the gate of the NVM cell and a second voltage to the gate of the respective reference cell such that the difference between the first and second voltages would depend on the temperature measured.

Alternatively, instead of changing gates' voltages as described hereinbefore, a specific reference cell may be selected from a pool of verify reference cells based on the temperature of the NVM cell of interest. Accordingly, an appropriate Program verify reference cell, or Erase verify reference cell, may be chosen, based on the monitored temperature, from a pool of Program verify reference cells, or from a pool of Erase verify reference cells.

In some preferred embodiments of the present invention, the program and erase margins may be verified by further comparing a margin DC signal either to the signal output from the NVM cell or the signal output from the reference cell, or both to the signals output from the NVM and reference cells, where the margin DC signal may be adjusted or selected to generate different program or erase margins based on the actual temperature of the NVM cell of interest.

In some preferred embodiments of the present invention, the program and erase margins may be verified by comparing the NVM cell output signal to a DC reference signal that is not necessarily generated by/in the reference cell. In this case, the DC reference signal may be adjusted, or selected, to generate different program or erase margins based on the actual temperature of the NVM cell of interest.

In some preferred embodiments of the present invention, the operating conditions of the NVM cells being read, or of peripheral circuits used to read the cells, may be adjusted based on the operating temperature.

Figure 4:
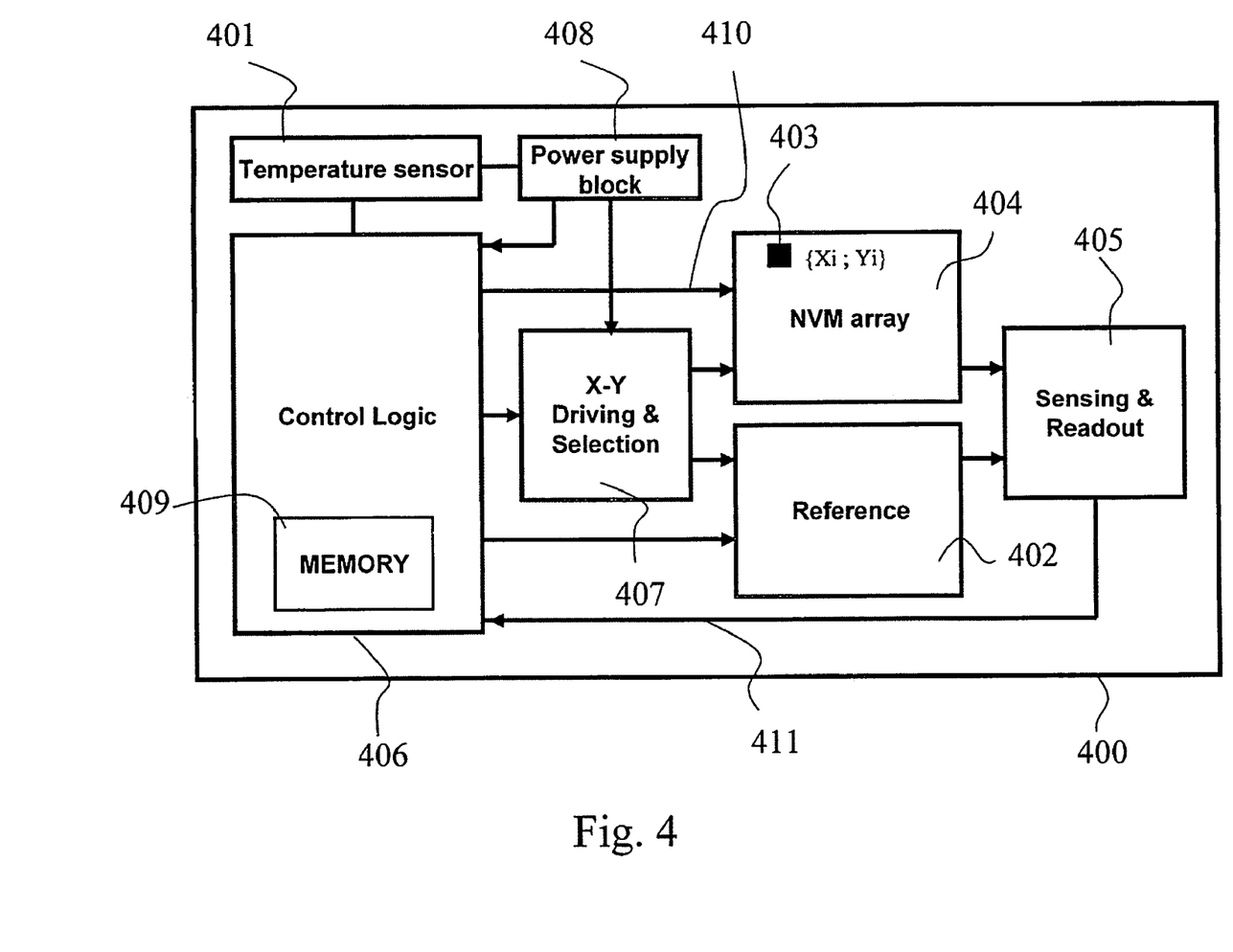
FIG. 4 is a block diagram showing an example of a non-volatile memory device according to some embodiment of the present invention.

Turning now to FIG. 4, it shows an example of a NVM device according to the present invention. NVM 400 is shown consisting of cells array 404, whose status may be, at times, verified (i.e., during a status change) or read. A 'change' or 'read' operation may be associated with a single NVM cell, designated (Xi; Yj, 'i' and 'j' being some integers), or with a group of cells. NVM 400 also includes temperature sensor 401, control logic 406, 'X-Y' Driving and Selection matrix 407, Reference module 402, Sensing and Readout module 405 and Power supply block 408. In describing the present invention, a reference will be made only to a single NVM cell (i.e., NVM cell 403). Of course, the status of any other NVM cell may be desirably verified or read in the way described hereinafter in respect to NVM cell 403.

In order to program or erase NVM cell 403, or to read its current state, cell 403 is first selected by control logic unit 406, its selection being made using logic unit 406, which cause 'X-Y' matrix 407 to activate, or to 'switch on', the appropriate array word line (not shown). Then, logic 406 applies to cell 403 (410) programming, or erasing (whatever the case may be) pulses, which are followed by program (or erase) verification steps that are carried out by comparing, in Sensing and Readout module 405, the output signal of cell 403 to a reference level (402) that is adjusted or selected by control logic 406. The program or erase pulses are applied to the NVM cell of interest (e.g., cell 403), and the comparison phase is in force (405) until sensing and readout module 405 sends an indication (411) to logic module 406, which allows logic module 406 to determine that the NVM cell of interest has reached the intended state (i.e., if programming or erasing operations were made), or to read the current state of the NVM cell (i.e., if only the current status of the cell was to be read).

Reference 402 may be a single reference cell whose output signal, which is used for comparison purposes (i.e., in Sensing and Readout module 405), is adjusted by control logic 406, such as by applying different voltages to the gates of cell 403 and the reference cell. The difference between the two gate voltages is determined by the control logic 406 and will depend on the actual temperature of cell 403 as sensed by temperature sensor 401. Reference block 402 may include several different types of 'single' reference cell; i.e., one Program verify reference cell, one Erase verify reference cell, etc., each type of reference cell being dedicated for specific operation made with respect to cell 403 (i.e., 'verifying program', 'verifying erase', etc.).

Alternatively, reference 402 may include a pool of reference cells of the same type from which control logic 406 would select an appropriate reference cell according to the actual temperature of cell 403 as sensed by temperature sensor 401. For example, reference block 402 may include a pool of program verify reference cells, a pool of erase verify reference cells or a pool of read verify reference cells.

In general, temperature sensor 401 senses the temperature of NVM cell 403 by being thermally coupled to NVM cell 403. Sensor 401 may sense the temperature of cell 403 either directly or indirectly. In the first case (i.e., direct temperature sensing), sensor 401 may be in direct physical contact with cell 403, whereas in the second case (i.e., indirect temperature sensing) the temperature of cell 403 may be sensed via some intermediating media. After obtaining the temperature reading; e.g., of cell 403, a single reference cell is adjusted, or an appropriate reference cell is selected from several reference cells, by control logic 406 as described hereinbefore.

Control logic 406 may include a memory array 409 for storing therein associations between temperatures, or temperature ranges, to corresponding reference cells. Given a specific temperature measurement, control logic 406 would utilize memory array 409 to first determine the relevant temperature range and, then, to associate the relevant temperature range to an appropriate reference level that should be used in conjunction with the NVM cell of interest (e.g., cell 403). As described hereinbefore, the reference level may be introduced (402) by adjusting the output of a single reference cell, or it can be introduced by selecting one reference cell from a pool of likewise reference cells.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A method for compensating over time and an operating temperature range for margin loss in non-volatile memory ("NVM") cell of interest, comprising adjusting, or selecting, a reference level based on a signal from a temperature sensing element thermally coupled to the NVM cell, which adjusted, or selected, reference level defining programming and erasing margins in respect of said NVM cell.

2. A method according to claim 1, wherein the reference level is adjusted by manipulating the output of a single reference cell by applying voltages to the gates of the NVM cell and said reference cell, the difference therebetween being dependent on the signal from the temperature sensing element.

3. A method according to claim 1, wherein the reference level is selected by selecting a reference cell from a pool of likewise reference cells based on the signal from the temperature sensing element.

4. A method according to claim 2, wherein the differences between the gates voltages increase as the temperature decreases.

5. A method according to claim 4, wherein the gates voltages difference is obtained based on its association to the temperature signal as stored in a conversion table.

6. A method according to claim 3, wherein the reference cell is selected from a pool of likewise reference cells based on its association to the temperature signal as pre-stored in a conversion table.

7. A method according to claim 2, wherein the adjusted reference cell is a program or an erase verifying reference cell.

8. A method according to claim 3, wherein the selected reference cell is a program or an erase verifying reference cell.

9. A method according to claim 7, wherein the program and erase verifying reference cells are differently adjusted for program and erase verify operations.

10. A method according to claim 8, wherein the program and erase verifying reference cells are differently selected for program and erase verify operations.

11. A method according to claim 9, wherein a reference cell for a program verify operation is selected such that its volt threshold ("VT") is higher as the temperature of the NVM cell increases.

12. A method according to claim 9, wherein a reference cell for an erase verify operation is selected such that its volt threshold ("VT") is lower as the temperature of the NVM cell decreases.

13. A method according to claim 1, wherein the program and/or erase margins are adjusted by adding a constant offset signal either to the NVM cell signal or to the reference cell signal, or both to the NVM cell and reference signals, during program or erase verify operations.

14. A method according to claim 1, wherein the program and erase margins are adjusted by selecting a different reference signal to be used in the program or erase verify operations.

15. A method according to claim 1, wherein the temperature reading is taken according to the following temporal regimes:
   the initiation instant of a program or erase operation;
   the initiation instant of a program verify or erase verify operation;
   at least once during a program, erase, or a verify operation; and
   the readings are taken intermittently or continuously.

16. A method according to claim 1, wherein the non-volatile memory cell and reference cell are NROM-type non-volatile memory cells.

17. A system for compensating over time and an operating temperature range for margin loss in non-volatile memory ("NVM") cell of interest in a NVM array of cells, comprising:
   a) a temperature sensing element(s) substantially thermally coupled to said cell or to said NVM array of cells, or to preferred portions thereof;
   b) a reference module operative to provide a reference level based on a signal from said temperature sensing element(s), against which said cell of interest is to be compared, which reference level defines program and erase margins;
   c) a sensing and readout module for performing the comparisons;
   d) an 'X-Y' driving and selection module operative to select the cell of interest from the NVM array of cells;
   e) a control logic operative to accept temperature readings from said temperature sensing element(s) for controlling the operation of said 'X-Y' driving and selection module and said reference module for performing program erase or reading operations on of said NVM cell; wherein said control logic is operative to accept a signal from said sensing and readout module to indicate the completion of said operations; and
   f) A power supply block for energizing the other modules.

18. A system according to claim 17, further comprising means for adjusting the reference level, which means adjusting the output of a single reference cell by applying voltages to the gates of the NVM cell of interest and said reference cell, the difference therebetween being dependent on the signal from the temperature sensing element.

19. A system according to claim 17, further comprising a pool of likewise reference cells from which the reference level is selected based on the signal from the temperature sensing element.

20. A system according to claim 18, in which the differences between the gates voltages increase as the temperature decreases.

21. A system according to claim 18, in which the gates voltages difference is obtained based on its association to a corresponding temperature range that is stored in a conversion table.

22. A system according to claim 20, in which the gates voltages difference is obtained based on its association to a corresponding temperature range that is stored in a conversion table.

23. A system according to claim 19, further comprising a conversion table, wherein the reference cell is selected from the pool of likewise reference cells based on its association to a corresponding temperature range that is stored in said conversion table.

24. A system according to claim 18 in which the adjusted reference cell is a program or an erase verifying reference cell.

25. A system according to claim 19, in which the selected reference cell is a program or an erase verifying reference cell.

26. A system according to claim 24, in which the program and erase verifying reference cells are differently adjusted for program and erase verify operations.

27. A system according to claim 25, in which the program and erase verifying reference cells are differently selected for program and erase verify operations.

28. A system according to claim 27, in which a reference cell for a program verify operation is selected such that its volt threshold ("VT") is higher as the temperature of the NVM cell increases.

29. A system according to claim 27, in which a reference cell for an erase verify operation is selected such that its volt threshold ("VT") is lower as the temperature of the NVM cell decreases.

30. A system according to claim 17, in which the program and/or erase margins are adjusted by adding a constant offset signal either to the NVM cell signal or to the reference cell signal, or both to the NVM cell and reference signals, during program or erase verify operations.

31. A system according to claim 17, in which the program and erase margins are adjusted by selecting a different reference signal to be used in the program or erase verify operations.

32. A system according to claim 17, in which the temperature reading is taken according to one of the following temporal regimes:
- at the initiation of a program or erase operation;
- the temperature reading is taken at the initiation of a program verify or erase verify operation;
- the temperature reading is taken at least once during a program, erase, or a verify operation; and
- temperature readings are taken intermittently or continuously.

33. A system according to claim 17, wherein the non-volatile memory array of cells and reference cells are NROM-type non-volatile memory cells.

34. A circuit for compensating over time and an operating temperature range for margin loss in non-volatile memory ("NVM") cell of interest, comprising:
- a) a temperature sensing element substantially thermally coupled to said NVM cell;
- b) a controller operative to select a reference level based on a signal from said temperature sensor, and to utilize it to perform program, erase or reading operation on said NVM cell, which reference level defining program and erase margins in respect of said NVM cell;
- c) adjusting means for adjusting the reference level by adjusting the output of a single reference cell by applying voltages to the gates of the NVM cell of interest and said reference cell, the difference therebetween being dependent on the signal from the temperature sensing element;
- d) a pool of likewise reference cells from which the reference level is selected based on the signal from the temperature sensing element';
- e) conversion table, for selecting the reference cell from the pool of likewise reference cells based on its association to a corresponding temperature range that is pre-stored in said conversion table;

wherein, the differences between the gates voltages increase as the temperature decreases, and wherein the gates voltages difference is obtained based on its association to a corresponding temperature range that is pre-stored in a conversion table, and wherein the adjusted, or selected, reference cell is a program or an erase verifying reference cell, and wherein the program and erase verifying reference cells are differently adjusted or selected for program and erase verify operations, and wherein a reference cell for a program verify operation is selected such that its volt threshold ("VT") is higher as the temperature of the NVM cell increases, and wherein a reference cell for an erase verify operation is selected such that its volt threshold ("VT") is lower as the temperature of the NVM cell decreases, and wherein the program and/or erase margins are adjusted by adding a constant offset signal either to the NVM cell signal or to the reference cell signal, or both to the NVM cell and reference signals, during program or erase verify operations, and wherein the program and erase margins are adjusted by selecting a different reference signal to be used in the program or erase verify operations, and wherein the temperature reading is taken at the initiation of a program or erase operation or is taken at the initiation of a program verify or erase verify operation or it is taken at least once during a program, erase, or a verify operation or the temperature readings are taken intermittently or continuously.

\* \* \* \* \*